US011221300B2

(12) United States Patent
Li

(10) Patent No.: US 11,221,300 B2
(45) Date of Patent: Jan. 11, 2022

(54) DETERMINING METROLOGY-LIKE INFORMATION FOR A SPECIMEN USING AN INSPECTION TOOL

(71) Applicant: KLA Corporation, Milpitas, CA (US)

(72) Inventor: Shifang Li, Pleasanton, CA (US)

(73) Assignee: KLA Corp., Milpitas, CA (US)

( * ) Notice: Subject to any disclaimer, the term of this patent is extended or adjusted under 35 U.S.C. 154(b) by 0 days.

(21) Appl. No.: 17/194,173

(22) Filed: Mar. 5, 2021

(65) Prior Publication Data

US 2021/0293724 A1 Sep. 23, 2021

Related U.S. Application Data

(60) Provisional application No. 62/992,423, filed on Mar. 20, 2020.

(51) Int. Cl.
| | | |
|---|---|---|
| *G01N 21/88* | (2006.01) | |
| *G01B 11/25* | (2006.01) | |
| *G01N 21/95* | (2006.01) | |
| *G01N 21/93* | (2006.01) | |

(52) U.S. Cl.
CPC ......... *G01N 21/8851* (2013.01); *G01B 11/25* (2013.01); *G01N 21/8806* (2013.01); *G01N 21/93* (2013.01); *G01N 21/95* (2013.01)

(58) Field of Classification Search
CPC .......... G01N 21/8851; G01N 21/8806; G01N 21/93; G01N 21/95; G01B 11/25
USPC ...................... 356/237.1–237.6, 239.1–239.8
See application file for complete search history.

(56) References Cited

U.S. PATENT DOCUMENTS

| | | |
|---|---|---|
| 7,570,796 B2 | 8/2009 | Zafar et al. |
| 7,676,077 B2 | 3/2010 | Kulkarni et al. |
| 8,126,255 B2 | 2/2012 | Bhaskar et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |
| 9,658,150 B2 | 5/2017 | Li et al. |
| 9,747,520 B2 | 8/2017 | Li et al. |
| 10,145,674 B2 | 12/2018 | Krishnan |
| 10,563,973 B2 | 2/2020 | Li et al. |
| 2015/0377796 A1 | 12/2015 | Schlezinger et al. |
| 2016/0116420 A1 | 4/2016 | Duffy et al. |

(Continued)

OTHER PUBLICATIONS

International Search Report and Written Opinion for PCT/US2021/021598 dated Jun. 29, 2021.

*Primary Examiner* — Tri T Ton
(74) *Attorney, Agent, or Firm* — Ann Marie Mewherter

(57) ABSTRACT

Methods and systems for determining metrology-like information for a specimen using an inspection tool are provided. One method includes determining first process information for first feature(s) formed in first area(s) on a specimen from output generated by output acquisition subsystem(s) that include an inspection subsystem. The method also includes determining second process information for second feature (s) formed in second area(s) on the specimen from the output and at least a portion of the first process information. At least a portion of the second process information is a different type of information than the first process information. At least a portion of a design for the second feature(s) is different than a design for the first feature(s), and the first area(s) and the second area(s) are mutually exclusive on the specimen.

25 Claims, 5 Drawing Sheets

(56) References Cited

U.S. PATENT DOCUMENTS

2018/0314773 A1  11/2018  Cheng et al.
2018/0321596 A1  11/2018  Wang
2018/0365369 A1  12/2018  Fouquet et al.
2020/0083080 A1   3/2020  Clark et al.

DETERMINING METROLOGY-LIKE INFORMATION FOR A SPECIMEN USING AN INSPECTION TOOL

BACKGROUND OF THE INVENTION

1. Field of the Invention

This invention generally relates to methods and systems for determining metrology-like information for a specimen using an inspection tool.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on reticles and wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on the specimen where defects have been detected by inspection. The higher resolution data for the defects generated by defect review is more suitable for determining attributes of the defects such as profile, roughness, more accurate size information, etc.

Metrology processes are also used at various steps during a semiconductor manufacturing process to monitor and control the process. Metrology processes are different than inspection processes in that, unlike inspection processes in which defects are detected on a specimen, metrology processes are used to measure one or more characteristics of the specimen that cannot be determined using currently used inspection tools. For example, metrology processes are used to measure one or more characteristics of a specimen such as a dimension (e.g., line width, thickness, etc.) of features formed on the specimen during a process such that the performance of the process can be determined from the one or more characteristics. In addition, if the one or more characteristics of the specimen are unacceptable (e.g., out of a predetermined range for the characteristic(s)), the measurements of the one or more characteristics of the specimen may be used to alter one or more parameters of the process such that additional specimens manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on a specimen may be independent of the results of an inspection process performed on the specimen. In particular, the locations at which a metrology process is performed may be selected independently of inspection results. In addition, since locations on the specimen at which metrology is performed may be selected independently of inspection results, unlike defect review in which the locations on the specimen at which defect review is to be performed cannot be determined until the inspection results for the specimen are generated and available for use, the locations at which the metrology process is performed may be determined before an inspection process has been performed on the specimen.

Evolution of the semiconductor manufacturing industry is placing ever greater demands on yield management and in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor fabricator.

Thus, inspection systems are evolving from stand-alone "tools" that just found defects to part of a more complete solution where detecting defects, classifying them, analyzing these results and recommending corrective action are their functions.

Existing systems and methods have been used for automatic defect inspection of semiconductor wafers. However, the inspection parameters of prior art systems and methods are rather limited in a high-throughput environment. For example, parameters such as coated film thickness or the process uniformity across the wafer are time-consuming and computationally expensive to measure.

Accordingly, it would be advantageous to develop systems and/or methods for determining information for a specimen that do not have one or more of the disadvantages described above.

SUMMARY OF THE INVENTION

The following description of various embodiments is not to be construed in any way as limiting the subject matter of the appended claims.

One embodiment relates to a system configured for determining information for a specimen. The system includes one or more output acquisition subsystems configured to generate output responsive to energy detected from a specimen. The one or more output acquisition subsystems include an inspection subsystem configured to generate at least a portion of the output responsive to the energy detected from the specimen while the energy is scanned over the specimen. The system also includes one or more computer subsystems configured for determining first information for one or more first features formed in one or more first areas on the specimen from the output. The one or more computer subsystems are also configured for determining second process information for one or more second features formed in one or more second areas on the specimen from the output and at least a portion of the first process information. At least a portion of the second process information is a different type of information than the first process information. At least a portion of a design for the one or more second features is different than a design for the one or more first features. The one or more first areas and the one or more second areas are mutually exclusive on the specimen. The system may be further configured as described herein.

Another embodiment relates to a computer-implemented method for determining information for a specimen. The method includes generating output responsive to energy detected from a specimen by one or more output acquisition subsystems configured as described above. The method also includes determining first process information and second process information as described above. Determining the first and second process information are performed by one or more computer subsystems coupled to the one or more output acquisition subsystems.

The steps of the method may be further performed as described further herein. The method may include any other step(s) of any other method(s) described herein. The method may be performed by any of the systems described herein.

An additional embodiment relates to a non-transitory computer-readable medium storing program instructions executable on a computer system for performing a computer-implemented method for determining information for a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
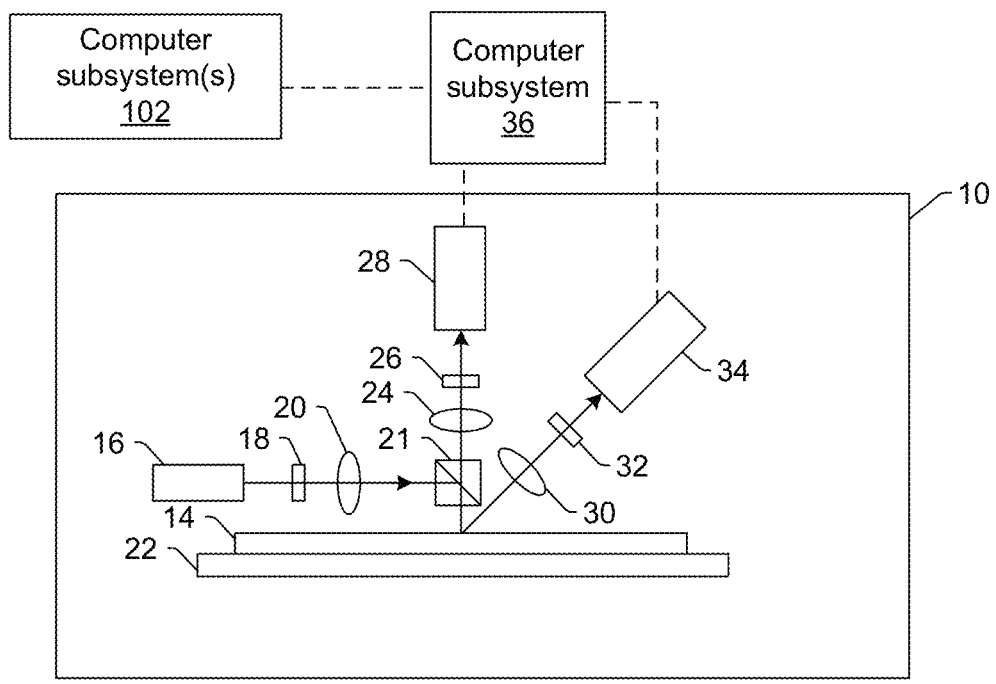
FIGS. 1 and 2 are schematic diagrams illustrating a side view of an embodiment of a system configured as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used interchangeably herein generally refer to the physical design (layout) of an IC or other semiconductor device and data derived from the physical design through complex simulation or simple geometric and Boolean operations. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data. Furthermore, the "design," "design data," and "design information" described herein refers to information and data that is generated by semiconductor device designers in a design process and is therefore available for use in the embodiments described herein well in advance of printing of the design on any physical specimens such as reticles and wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured for determining information for a specimen. In general, the embodiments described herein are configured to determine multiple process parameters using inspection data from semiconductor wafers and other specimens described herein. The embodiments may also be used as extensions to and enhancements of other currently used systems and methods for determining metrology-like results from inspection tools (i.e., analyzing data from an inspection tool to find process information), which may be referred to in the art as "Metrospection." Some examples of currently used systems and methods for Metrospection are described in U.S. Pat. No. 9,658,150 to Li et al. issued May 23, 2017, U.S. Pat. No. 9,747,520 to Li et al. issued Aug. 29, 2017, and U.S. Pat. No. 10,563,973 to Li et al. issued Feb. 18, 2020, which are incorporated by reference as if fully set forth herein. The embodiments described herein may be further configured as described in these patents.

Metrospection is quite new and not widely adapted yet. One proposed system described in the above-referenced U.S. Pat. No. 9,658,150 modifies the hardware to expand the information contents. Due to the data rate and the throughput limitations, that method may meet physical limitations relatively soon, e.g., one may have a few (e.g., 2 or 3) measurement quantities per pixel, and these may be expanded to say 6 with reasonable effort and complexity of the hardware.

There are similar issues in metrology practice, which have significant and noticeable differences from the embodiments described herein. Following are three categories of solutions in metrology practice in order of emerging from most recent to earlier in time. One category is filling such as that described in U.S. Pat. No. 10,145,674 to Krishnan issued Dec. 4, 2018, which is incorporated by reference as if fully set forth herein. These systems and methods measure the target before and after filling the grooves (or holes) on a wafer with water. Another category is performing multiple measurements with different methods (e.g., ellipsometers, reflectometers) at different incident conditions (multiple angles of incidence (AOIs) and azimuth angles). An additional category is feedforward that includes measuring the target at a process step before, saving the results (e.g., thickness of deposited layers), then feeding the results from previous measurements to current layer as predetermined parameters. The differences between these methods and the embodiments described herein will be readily apparent upon reading the following detailed description.

In some embodiments, the specimen is a wafer. The wafer may include any wafer known in the semiconductor arts. Although some embodiments may be described herein with respect to a wafer or wafers, the embodiments are not limited in the specimens for which they can be used. For example, the embodiments described herein may be used for specimens such as reticles, flat panels, personal computer (PC) boards, and other semiconductor specimens.

The system includes one or more output acquisition subsystems configured to generate output responsive to energy detected from a specimen. The one or more output acquisition subsystems include an inspection subsystem configured to generate at least a portion of the output responsive to the energy detected from the specimen while the energy is scanned over the specimen. One embodiment of such a system is shown in FIG. 1. In this embodiment, the inspection subsystem includes at least an energy source and a detector. The energy source is configured to generate energy that is directed to a specimen. The detector is configured to detect energy from the specimen and to generate output responsive to the detected energy.

In one embodiment, the inspection subsystem is configured as an optical inspection subsystem. For example, in the embodiment of the system shown in FIG. 1, inspection subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to beam splitter 21, which directs the light to specimen 14 at a normal angle of incidence. The angle of incidence may include any suitable angle of incidence, which may vary depending on, for instance, characteristics of the specimen and the defects to be detected on the specimen.

The illumination subsystem may be configured to direct the light to the specimen at different angles of incidence at different times. For example, the inspection subsystem may be configured to alter one or more characteristics of one or more elements of the illumination subsystem such that the light can be directed to the specimen at an angle of incidence that is different than that shown in FIG. 1. In one such example, the inspection subsystem may be configured to move light source 16, optical element 18, and lens 20 such that the light is directed to the specimen at a different angle of incidence.

In some instances, the inspection subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen).

In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

Light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to specimen 14 via beam splitter 21 by lens 20. Although lens 20 is shown in FIG. 1 as a single refractive optical element, in practice, lens 20 may include a number of refractive and/or reflective optical elements that in combination focus the light from the optical element to the specimen. In addition, the position of lens 20 may vary from that shown in FIG. 1. For example, lens 20 may be positioned in the path of the light from beamsplitter 21 to specimen 14 so that it focuses the light to the specimen and also collects light from the specimen. If lens 20 or another lens or lenses is or are located between beamsplitter 21 and the specimen, such lens(es) may be referred to as an objective. Lens 20 may also be replaced by or made up of multiple elements located in various positions (such as a first lens before element 18 and another lens after element 18 that in combination efficiently deliver light from light source 16 to specimen 14). The illumination subsystem may include any or all of such lenses, which are represented generically by lens 20 in FIG. 1.

The illumination subsystem shown in FIG. 1 and described herein may include any other suitable optical elements (not shown). Examples of such optical elements include, but are not limited to, polarizing component(s), spectral filter(s), spatial filter(s), reflective optical element (s), apodizer(s), beam splitter(s), aperture(s), and the like, which may include any such suitable optical elements known in the art. In addition, the system may be configured to alter one or more of the elements of the illumination subsystem based on the type of illumination to be used for inspection.

The inspection subsystem may also include a scanning subsystem configured to cause the light to be scanned over the specimen. For example, the inspection subsystem may include stage 22 on which specimen 14 is disposed during inspection. The scanning subsystem may include any suitable mechanical and/or robotic assembly (that includes stage 22) that can be configured to move the specimen such that the light can be scanned over the specimen. In addition, or alternatively, the inspection subsystem may be configured such that one or more optical elements of the inspection subsystem perform some scanning of the light over the specimen. The light may be scanned over the specimen in any suitable fashion.

The inspection subsystem further includes one or more detection channels. At least one of the one or more detection channels includes a detector configured to detect light from the specimen due to illumination of the specimen by the inspection subsystem and to generate output responsive to the detected light. For example, the inspection subsystem shown in FIG. 1 includes two detection channels, one formed by collector 24, element 26, and detector 28 and another formed by collector 30, element 32, and detector 34. Collector 24 and/or collector 30 may be configured to manipulate the light from the specimen in a way best fit to detector 28 and/or detector 24, respectively. Collectors 24 and 30 may also be referred to as tube lenses or relay lenses. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 1 shows an embodiment of the inspection subsystem that includes two detection channels, the inspection subsystem may include a different number of detection channels (e.g., only one detection channel or two or more detection channels). Although each of the collectors are shown in FIG. 1 as single refractive optical elements, in practice, each of the collectors may include one or more refractive optical element(s) and/or one or more reflective optical element(s).

The one or more detection channels may include any suitable detectors such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the light such as intensity but may not be configured to detect such characteristics as a function of position within the imaging plane. As such, the output that is generated by each of the detectors included in each of the detection channels of the inspection subsystem may be signals or data, but not image signals or image data. In such instances, a computer subsystem such as computer subsystem 36 of the system may be configured to generate images of the specimen from the non-imaging output of the detectors. However, in other instances, the detectors may be configured as imaging detectors that are configured to generate imaging signals or image data. Therefore, the system may be configured to generate the output described herein in a number of ways.

Although FIG. 1 shows one illumination channel configured for normal incidence illumination and different detection channels configured for detecting light from the specimen, as described above, there are many variations of the illustrated inspection subsystem that fall within the scope of the present disclosure. Different inspection system configurations are more or less suitable for different purposes. For example, the detection channel that includes collector 30, element 32, and detector 34 and is configured to detect light scattered from the specimen as shown in FIG. 1 (i.e., an oblique collection channel) may be suitable for imaging a substantially narrow line illuminated on the specimen. However, for cases using TDI or CCD cameras for the detectors, it can be a disadvantage to image with oblique angle (relative to normal of the specimen) from an optic engineering point of view. So, in such cases, one suitable variation of the inspection subsystem from that shown in FIG. 1 may be replacing detector 34 with a light source (for oblique illumination) with collection/imaging of light from this illumination channel performed by the detection channel that includes detector 28. Such a system may then include different illumination channels, and the light from the specimen due to the different illumination channels can be separately detected by a single detection channel using either spatial separation or time multiplexing to distinguish if the light is coming from light source 16 or 34 (when detector 34 is replaced with a light source).

It is noted that FIG. 1 is provided herein to generally illustrate a configuration of an inspection subsystem that may be included in the system embodiments described herein. Obviously, the inspection subsystem configuration described herein may be altered to optimize the performance of the system as is normally performed when designing a commercial inspection system. In addition, the systems described herein may be implemented using an existing inspection system (e.g., by adding functionality described herein to an existing inspection system) such as the 29xx and 39xx series of tools that are commercially available from KLA Corp., Milpitas, Calif. For some such systems, the methods described herein may be provided as optional functionality of the system (e.g., in addition to other functionality of the system). Alternatively, the system described herein may be designed "from scratch" to provide a completely new system.

Computer subsystem 36 of the system may be coupled to the detectors of the inspection subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Figure 2:
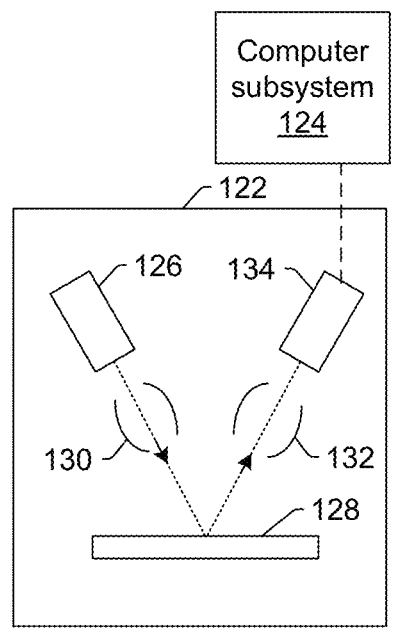

In another embodiment, the inspection subsystem is configured as an electron beam inspection subsystem. In one such embodiment shown in FIG. 2, the electron beam inspection subsystem includes electron column 122, which is coupled to computer subsystem 124. As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are scattered from the specimen at another oblique angle, the electron beam may be directed to and scattered from the specimen at any suitable angles. In addition, the electron beam based tool may be configured to use multiple modes to generate images of the specimen (e.g., with different illumination angles, collection angles, etc.). The multiple modes of the electron beam based tool may be different in any image generation parameters of the tool.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the electron beam inspection subsystem shown in FIG. 2 may be further configured as described herein.

It is noted that FIG. 2 is provided herein to generally illustrate a configuration of an electron beam inspection subsystem that may be included in the embodiments described herein. As with the optical inspection subsystem described above, the electron beam inspection subsystem described herein may be altered to optimize the performance of the electron beam inspection subsystem as is normally performed when designing a commercial inspection system. In addition, the systems described herein may be implemented using an existing electron beam inspection system (e.g., by adding functionality described herein to an existing electron beam inspection system). For some such systems, the methods described herein may be provided as optional functionality of the system (e.g., in addition to other functionality of the system). Alternatively, the system described herein may be designed "from scratch" to provide a completely new system.

Although the inspection subsystem is described above as being an optical or electron beam inspection subsystem, the inspection subsystem may be an ion beam inspection subsystem. Such an inspection subsystem may be configured as shown in FIG. 2 except that the electron beam source may be replaced with any suitable ion beam source known in the art. In addition, the inspection subsystem may be any other suitable ion beam tool such as those included in commercially available focused ion beam (FIB) systems, helium ion microscopy (HIM) systems, and secondary ion mass spectroscopy (SIMS) systems.

As noted above, the inspection subsystems may be configured for directing energy (e.g., light, electrons) to and/or scanning energy over a physical version of the specimen thereby generating actual images for the physical version of the specimen. In this manner, the inspection subsystems may be configured as "actual" systems, rather than "virtual" systems. A storage medium (not shown) and computer subsystem(s) 102 shown in FIG. 1 may be configured as a "virtual" system. Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents.

The inspection subsystems described herein may be configured to generate output, e.g., images, of the specimen with multiple modes. In general, a "mode" is defined by the values of parameters of the inspection subsystem used for generating images of a specimen or the output used to generate images of or perform other functions for the specimen. Therefore, modes that are different may be different in the values for at least one of the parameters of the inspection subsystem. In this manner, the output may be generated by the inspection subsystem with two or more different values of a parameter of the inspection subsystem. For example, in an optical inspection subsystem, different modes may use different wavelengths of light for illumination. The modes may be different in the illumination wavelength as described further herein (e.g., by using different light sources, different spectral filters, etc.) for different modes. The modes may also or alternatively be different in one or more collection/detection parameters of the inspection subsystem.

In a similar manner, the output generated by the electron beam inspection subsystem may include output, e.g., images, generated by the electron beam inspection subsystem with two or more different values of a parameter of the electron beam inspection subsystem. The multiple modes of the electron beam inspection subsystem can be defined by the values of parameters of the electron beam inspection subsystem used for generating output and/or images for a specimen. Therefore, modes that are different may be different in the values for at least one of the electron beam parameters of the electron beam inspection subsystem. For example, different modes may use different for illumination.

In one embodiment, the one or more output acquisition subsystems include a metrology tool configured to generate at least another portion of the output by performing measurements at measurement points on the specimen. Metrology and inspection are generally treated as separate domains in semiconductor manufacturing. For example, metrology is typically calibrated to a reference standard, and inspection is typically performed by comparing acquired signal results (output, signals, images, etc.) from proximate structures (e.g., within die, die-to-die, etc.) or versus a stored reference (recorded or generated through simulation or otherwise synthesized). Additional differences between inspection and metrology are described in the description of the related art provided herein.

The metrology tool may have any suitable configuration known in the art. In one example, the optical and electron beam inspection subsystems described herein may be modified in one or more parameters such that they can be configured and used as metrology tools. In particular, the embodiments of the inspection subsystems described herein and shown in FIGS. 1 and 2 may be modified in one or more parameters to provide different capability depending on the application for which they will be used. In one such example, the inspection subsystems shown in FIGS. 1 and 2 may be configured to have a higher precision if they are to be used for metrology rather than for inspection. In other words, the embodiments of the inspection subsystems shown in FIGS. 1 and 2 describe some general and various configurations that can be tailored in a number of manners that will be obvious to one skilled in the art to produce subsystems having different capabilities that are more or less suitable for different applications such as inspection and/or metrology. In addition, if the same subsystem has variable hardware settings such that it can be used for both inspection and metrology, then the same subsystem can be used to generate both the inspection subsystem output and metrology data described herein.

The inspection subsystems described herein may then be configured to generate different output during inspection of a specimen than during metrology. For example, even if the inspection subsystems described herein are configurable to have output generation parameters that would render them suitable for metrology, during an inspection process, the inspection subsystem would be configured with other output generation parameters to achieve the predetermined throughput of the inspection process. In one such example, inspection tools are generally configured to have much higher spatial resolution than metrology tools. However, metrology tools are generally configured to provide much higher quality data. In terms of "high quality," there are two aspects that apply to metrology output: (a) more information at each measurement point (such as Mueller matrix polarization information, spectra for wide wavelength range and resolution. etc.), and (b) typically higher precision (i.e., lower noise levels). As a result, metrology tools acquire more information per measurement point but can test only a few measurement points per second so relatively high spatial resolution is not affordable or practical. In contrast, inspection tools can test millions of points per second and therefore provide affordable, relatively high spatial resolution output but acquire substantially limited information at each point as a tradeoff.

Figure 3:
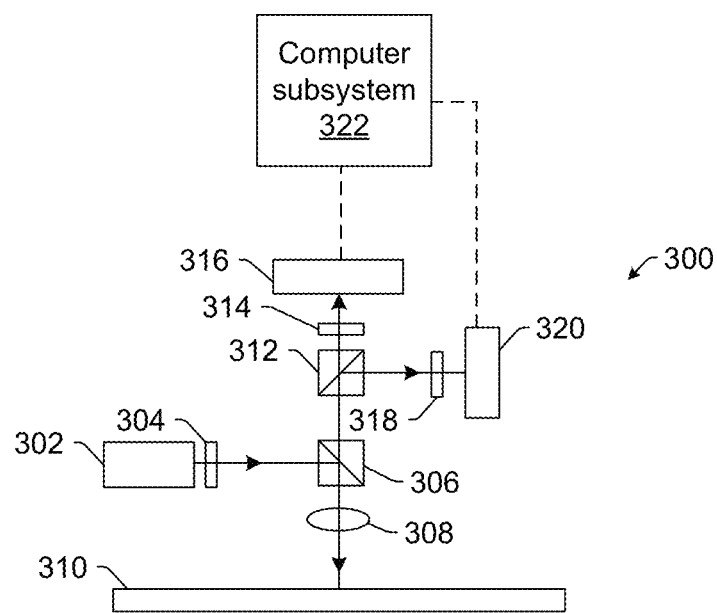
FIG. 3 is a schematic diagram illustrating a side view of an embodiment of a metrology tool configured as described herein.

FIG. 3, however, shows another embodiment of a metrology tool that may perform measurements on the specimen as described herein. In the case of an optical metrology tool, the metrology tool may include an illumination subsystem configured to direct light having one or more illumination wavelengths to a specimen. For example, in the metrology tool embodiment shown in FIG. 3, the illumination subsystem of metrology tool 300 includes light source 302, which may include any of the light sources described herein. Light generated by light source 302 may be directed through one or more spectral filters 304 of the illumination subsystem. Spectral filter(s) 304 may be configured as described further herein. The illumination subsystem may also include beamsplitter 306 that is configured to reflect light from the spectral filter(s) to objective 308 of the illumination subsystem. Beamsplitter 306 and objective 308 may be further configured as described herein. Objective 308 is configured to focus light having the one or more illumination wavelengths from the beamsplitter to specimen 310, which may include any of the specimens described herein.

In one embodiment, light source 302 may be a broadband light source, and one or more spectral filters 304 may be positioned in a path of light from the broadband light source. Therefore, the metrology tool may include a broadband source with a selectable wavelength range for illumination through wavelength dependent filters. For example, the wavelength(s) directed to the specimen may be altered by changing or removing the spectral filter(s) positioned in the path of the light from the light source. In this manner, the metrology tool may be configured to have flexible illumination wavelength(s) that can be varied depending on the materials on the specimen.

The metrology tool may also incorporate narrower or modified bandpass filters into the illumination subsystem. For example, spectral filter(s) 304 may be interference filter(s). In this manner, the metrology tool may include a broadband source with a selectable wavelength range for illumination through interference filters. These filters can complement or replace bandpass filters currently being used in tools.

Light source 302 may also include narrowband and/or laser light source(s), including any suitable such light sources known in the art such as one or more diode lasers, diode-pumped solid state (DPSS) lasers, gas lasers, etc. In addition, the illumination subsystems described herein may include any number of broadband, narrowband, and laser light sources in any suitable combination. Furthermore, the light sources may be quasi-monochromatic light sources. Therefore, many different combinations of light sources and metrology tool configurations are possible and may be selected depending on, for example, the specimen and/or specimen characteristics that are to be measured by the tool.

The illumination subsystem may be configured in a number of different ways for selective illumination angle and/or polarization. For example, the illumination angle may be altered or selected by changing a position of a light source of the illumination subsystem or by controlling one or more other elements of the illumination subsystem that affect the illumination angle. The illumination angle that is altered or selected may be the polar angle and/or the azimuthal angle of the incident light. In addition, the illumination polarization may be selected by selecting a light source that emits light having the selected polarization or by including one or more polarization selection/alteration/filtering elements in the path of the light emitted by the light source.

The metrology tool also includes a detection subsystem configured to detect light from the specimen. As shown in FIG. 3, the detection subsystem includes objective 308 configured to collect light from specimen 310. In this embodiment, the collected light may include specularly reflected light. However, the collected light may alternatively or additionally include scattered light. The detection subsystem may also include beamsplitter 306 configured to transmit the light collected by the objective lens.

In some cases, the detection subsystem includes beamsplitter 312 configured to transmit light from beamsplitter 306 having one or more wavelengths. The detection subsystem may also include one or more bandpass filters 314 that may be configured as described further herein and may transmit light having one or more selected wavelengths. Beamsplitter 306, beamsplitter 312, and bandpass filter(s) 314 may be configured to selectively transmit light having one or more selected wavelengths and to reflect or otherwise block light that does not have the one or more selected wavelengths out of the detection path of the detection subsystem such that they are not detected by detector 316.

In some instances, the detection subsystem includes one or more bandpass filters 318 and detector 320. In the configuration shown in FIG. 3, light reflected by beamsplitter 312 is directed to one or more bandpass filters 318, and light transmitted by the one or more bandpass filters is detected by detector 320. Bandpass filter(s) 318 and detector 320 may be further configured as described herein. Beamsplitter 312 may be configured to transmit light having one or more first wavelengths and to reflect light having one or more second wavelengths different than the first wavelength(s). In this manner, detectors 316 and 320 may detect light having different wavelengths.

As shown in FIG. 3, the illumination and detection subsystems may both include objective 308 making it a common objective lens and beamsplitter 306 making it a common dichroic mirror or beamsplitter. In addition, any beamsplitters described herein can be replaced with dichroic mirrors that reflect certain wavelength bands of light and transmit the corresponding out of band light. Such configurations could increase the amount of light delivered to the specimen and increase the purity of the detected signal.

In one embodiment, one or more wavelengths of the light detected by the detection subsystem are selected by altering one or more parameters of the detection subsystem based on one or more materials on the specimen, one or more characteristics of the specimen that are being measured, or some combination thereof. Therefore, like the illumination wavelength range, the detection wavelength range can be adjusted depending on the specimen materials and the specimen characteristic(s) being measured. The wavelength(s) detected by the detection subsystem may be altered as described herein (e.g., using bandpass filter(s)) or in any other suitable manner known in the art.

The metrology tool can include multiple parallel imaging channels that image varying wavelength ranges through suitable selection of dichroic and bandpass filter components. In the embodiment shown in FIG. 3, one of the channels may include bandpass filter(s) 314 and detector 316 and the other of the channels may include bandpass filter(s) 318 and detector 320. In addition, the metrology tool may include more than two channels (e.g., by insertion of one or more additional beamsplitters (not shown) into the path of the light from the specimen, each of which may be coupled to a detector (not shown) and possibly spectral filters (not shown) and/or other optical elements (not shown)). The channel including bandpass filters(s) 314 and detector 316 may be configured to detect light in a first wavelength band, and the channel that includes bandpass filter(s) 318 and detector 320 may be configured to detect light in a second wavelength band. In this manner, different wavelength ranges of light may be detected by different channels simultaneously. In addition, the different wavelength ranges may be mutually exclusive (e.g., separated by one or more wavelengths) or may overlap entirely (e.g., one wavelength range may be entirely within another wavelength range) or partially (e.g., multiple wavelength ranges may include the same one or more wavelengths, but at least some of the wavelengths in a first wavelength range are mutually exclusive of at least some of the wavelengths in a second wavelength range, and vice versa). In some embodiments, the detection subsystem includes a spectrometer configured to measure a characteristic of the light from the specimen across a wavelength range. For example, one or more of detectors 316 and 320 may be a spectrometer.

As described above, the detection subsystem may be configured to selectively and separately detect the light from the specimen based on the wavelength of the light. In a similar manner, if the illumination subsystem is configured for selective illumination angle and/or polarization, the detection subsystem may be configured for selective detection of light based on angle from the specimen (or collection angle) and/or polarization. For example, the detection subsystem may include one or more apertures (not shown) that can be used to control the collection angles of the light detected by the detection subsystem. In another example, the detection subsystem may include one or more polarizing components (not shown) in the path of the light from the specimen that can be used to control the polarizations of the light detected by the detection subsystem.

In one such variation, the metrology tool may be varied from that shown in FIG. 3 so that all wavelengths of light from light source 302 are sent to specimen 310. The wavelengths may then be separated at the detector(s), typically via spectrometer(s). If the metrology tool is configured in this manner, then it may not include spectral filter(s) 304 and bandpass filters 314 and 318. Such a configuration may have advantages for light efficiency, because instead of blocking most wavelengths at the light source, the metrology system may let them all go through the system and detect all wavelengths simultaneously at the detector(s) via spectrometer(s). This configuration is possible for metrology tools since metrology tools typically test a point at a time. On the other hand, inspection tools almost always run in imaging mode and thus it may not be affordable to do wavelength analysis at the detector. As such, in inspection systems, a wavelength filter may be used in the illumination channel.

In another such variation, spectral filter(s) 304 and bandpass filters 314 and 318 may be replaced with polarization elements. For example, instead of spectral filter(s), element 304 may be a polarization controller such as a polarizer, and instead of bandpass filters, elements 314 and 318 may be analyzers. In such a metrology tool configuration, detectors 316 and 320 may be configured as spectrometers (that fan out the wavelengths to an array detector).

The metrology tool also includes a computer subsystem configured to generate metrology data for the specimen using output generated by the detection subsystem responsive to the detected light. For example, the metrology tool may include computer subsystem 322, which may be coupled to detectors 316 and 320 as described above, such that the computer subsystem can receive output generated by the detectors of the detection subsystem. The output of the detectors may include, for example, signals, images, data, image data, and the like. For example, the detector(s) of the detection subsystem described above may be imaging detectors that are configured to capture image(s) of the specimen. The computer subsystem may be further configured as described herein. The metrology data may be any of the metrology data described herein. The metrology data may be stored in (or output as) a metrology results file.

It is noted that FIG. 3 is provided herein to generally illustrate some configurations of the metrology tool embodiments described herein. Obviously, the metrology tool configurations described herein may be altered to optimize the performance of the metrology tool as is normally performed when designing a commercial metrology tool. In addition, the metrology tools described herein may include an existing metrology tool (e.g., by adding functionality described herein to an existing metrology tool) such as Archer, ATL, SpectraShape, SpectraFilm, Alerts, WaferSight, ThermaProbe, RS-200, and Profiler tools that are commercially available from KLA. For some such systems, the methods described herein may be provided as optional functionality of the existing metrology tool (e.g., in addition to other functionality of the existing tool). Alternatively, the metrology tool described herein may be designed "from scratch" to provide a completely new system.

Although the metrology tool shown in FIG. 3 is a light-based or optical tool, the metrology tool may be configured to also or alternatively use a different type of energy to perform the measurements described herein. For example, the metrology tool may be an electron beam tool such as a scanning electron microscope (SEM) or a transmission electron microscope (TEM) and/or a charged particle beam tool such as a FIB tool. Such metrology tools may include any suitable commercially available metrology tool.

As described further herein, the measurement point locations may be determined to measure first process information for one or more first features across the specimen, which may include one or more materials on the specimen and/or one or more patterned structures on the specimen. In some contexts, the first feature(s) may be considered defects based on the measured first process information. For example, one linkage between the metrology and inspection domains is that defects may occur during specimen processing if the first process information sufficiently deviates from specifications. In the embodiments described herein, the first process information for the specimen may be purposefully measured regardless of whether the first process information renders the first feature(s) defective. For example, even when the measured first process information does not cause the first feature(s) to be considered defective, the first process information can be used to determine the second process information as described further herein. In addition, if a defect happens to be present at one of the preselected measurement points, it may actually affect the metrology data generated at that measurement point. However, such measurements (of defects or characteristic(s) that render the specimen defective) are not the goal of the measurements described herein.

The first feature(s), first area(s), second feature(s), and second area(s) described herein are also not selected based on defects or process deviations but based on the design for the specimen. For example, in each die on a specimen, there are different areas that are used to build different electrical functioning units. As a result, different structures are required to be in different areas at each process step. As an example, at a process step, the areas shown in FIG. 5b need to have the structure shown in FIG. 5a. Likewise, the areas shown in FIG. 5d need to have the structure shown in FIG. 5c. The locations of these areas are predetermined by the design layout for the specimen independently of any defects or process deviations detected on the specimen. Therefore, even if defect or process deviation information is available for the specimen, the first features, first areas, second features, and second areas described herein are not selected based on such information.

It may be desirable to select or determine the first areas that are measured by the metrology tool based on throughput and cost considerations while still being sufficiently responsive to the variations of interest (described further herein) in the measurements. For example, the desired measurements (e.g., specimen topology, film thickness, critical dimension (CD), etc.) may be performed in first areas on the specimen that are selected to allow reliable prediction (e.g., interpolation, extrapolation, etc.) of the measurements to any second areas on the specimen.

Different first areas may be selected for different use cases. For example, film thickness variations tend to be relatively slow across the specimen so the density of film thickness measurements could be relatively low. Therefore, a density of the first areas that is suitable for the embodiments described herein includes any density of first areas that is large enough to make the prediction of the metrology data to the second areas sufficiently accurate.

In one embodiment, the one or more first areas are selected to capture specimen level variations in the first process information. In another embodiment, the one or more first areas are selected to capture die level variations in the first process information. For example, the measurements may be preferably performed in selected first area(s) on the specimen with sufficient frequency to capture specimen-level and/or die-level variations. The frequency or density of the first area(s) needed to capture specimen-level or die-level variations may be determined as described above, e.g., based on the expected variations in the metrology measurements that are performed and/or the expected first process information.

The first process information, e.g., metrology data, can be determined or generated from the measurements performed in the first areas in any suitable manner. In other words, many different methods, algorithms, models, functions, etc. are available in the art to determine the metrology data from the measurements. The metrology data used in the embodiments described herein may be generated in any of these known ways. In addition, metrology analysis (e.g., modeling of metrology data) may be performed on the 5D Analyzer system, which is commercially available from KLA. This system is established in the industry and contains capabilities for advanced metrology analysis. Metrology data can be delivered from this system or directly from the metrology tool if no further modeling is required.

In one embodiment, the first process information includes one or more of film thickness, patterned structure profile, CD, line edge roughness (LER), and line width roughness (LWR). For example, the first process information that may be particularly useful in embodiments described herein includes film thickness(es) and any other such characteristic(s) that can be useful for determining the second process information as described further herein. In other words, the first process information described herein can include any and all measurements and/or specimen characteristic(s) that can be used for determining second process information as described further herein. The measurements described herein may also be performed as described in commonly assigned U.S. Patent Application Publication No. 2016/0116420 by Duffy et al. published Apr. 28, 2018, which is incorporated by reference as if fully set forth herein. The embodiments described herein may be further configured as described in this publication.

In one embodiment, the metrology tool is not included in the system. For example, the metrology tool may be included in one system that is different and separate from the system embodiments described herein. In other words, the metrology tool may be included in a system that is physically separate from the embodiments described herein and may not share any common elements with the system embodiments described herein. In particular, as shown in FIGS. 1 and 3, the inspection subsystem may be included in one system, the metrology tool may be configured as another system, and the system and metrology tool are completely physically separate from each other and share no common hardware elements.

In such embodiments, the one or more computer subsystems described herein may be configured to access and acquire the metrology data from a computer subsystem coupled to the metrology tool and/or a storage medium in which the metrology data has been stored by the metrology tool. The one or more computer subsystems may acquire the metrology data from another computer system or subsystem or a storage medium as described further herein. In this manner, the metrology tool and the system that includes the inspection subsystem may be different tools. The metrology data can be stored in a database (such as Klarity, commercially available from KLA), from where the measurements can be retrieved.

In this manner, acquiring the metrology data does not necessarily include generating the metrology data. For example, as described above, the metrology tool may be configured to generate the metrology data and then a computer subsystem described herein may acquire the metrology data from the metrology tool, a computer subsystem of the metrology tool, or a storage medium in which the metrology data has been stored. As such, the metrology data that is acquired may have been generated by a system other than the embodiments described herein. However, in some embodiments, acquiring the metrology data may include generating the metrology data. For example, the embodiments described herein may include a metrology tool (as described further herein), and therefore the system embodiments described herein may be configured for generating the metrology data by performing the measurements on the specimen in the first areas. Alternatively, the system embodiments (or one or more elements of the system) described herein may be configured to cause the metrology tool to perform the measurements on the specimen. Therefore, acquiring the metrology data may include performing the measurements on the specimen in the first areas.

Figure 4:
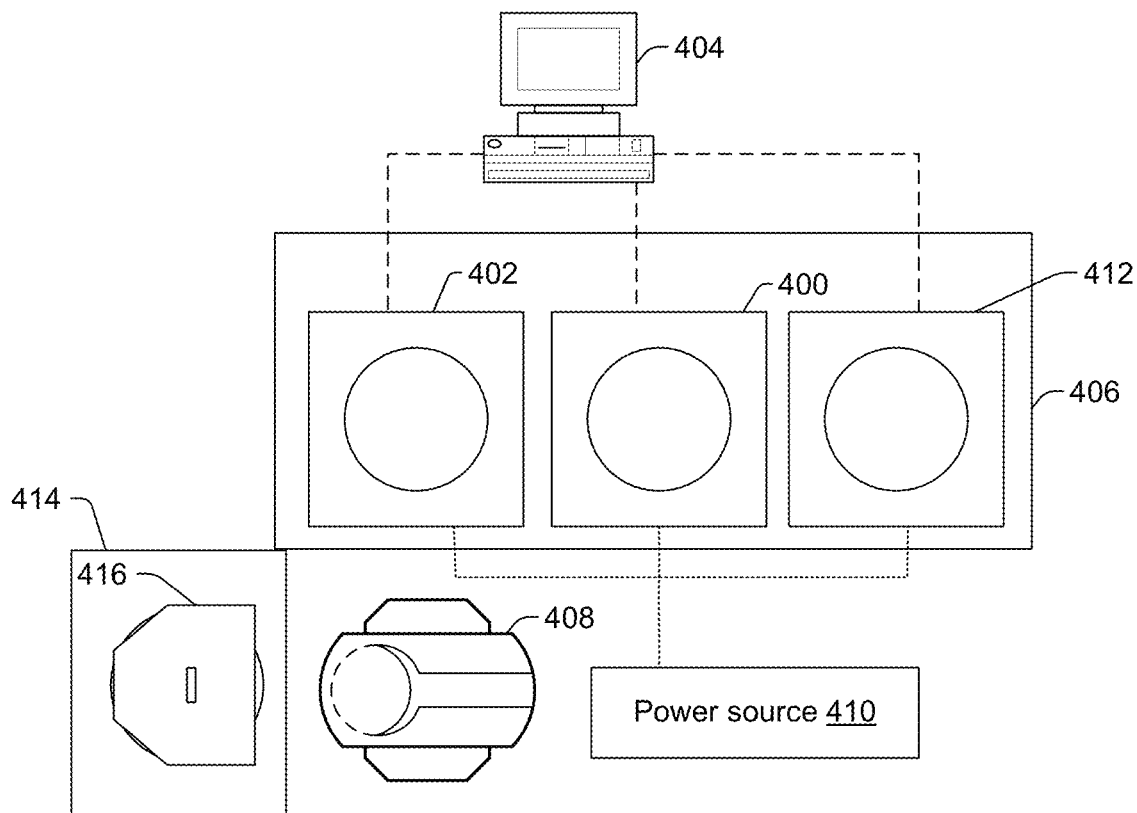
FIG. 4 is a schematic diagram illustrating a plan view of an embodiment of a system configured as described herein.

In one embodiment, the metrology tool is incorporated into the system such that the inspection subsystem and the metrology tool share one or more common elements of the system. FIG. 4 illustrates one embodiment of such a system. The system includes inspection subsystem module 400 and metrology tool module 402. The inspection subsystem included in module 400 may be configured as described herein with respect to FIGS. 1 and 2. The metrology tool included in module 402 may be configured as described herein with respect to FIG. 3. The system may also include computer subsystem 404 coupled to one or both of the inspection subsystem and the metrology tool. Computer subsystem 404 may be configured according to any other embodiments described herein.

In some embodiments, the system also includes additional module 412, and the additional module may be configured to perform one or more additional processes on the specimen. The one or more additional processes may include, for example, defect review, defect repair, and/or any other quality-control related processes.

The one or more common elements that may be shared by the metrology tool and the inspection subsystem may include one or more of common housing 406, common specimen handler 408, common power source 410, computer subsystem 404, or some combination thereof. The common housing may have any suitable configuration known in the art. For example, an original housing of the system may simply be expanded to accommodate the metrology tool. In this manner, the metrology tool and the inspection subsystem may be configured as a single unit or tool. The common specimen handler may include any suitable mechanical and/or robotic assembly known in the art. The common specimen handler may be configured to move the specimen between the metrology tool and the inspection subsystem in such a way that a specimen can be moved from the metrology tool directly into the inspection subsystem without having to put the specimen back into its cassette or other container between the processes. The common power source may include any suitable power source known in the art. The computer subsystem may be coupled to the metrology tool as described further herein as well as to the inspection subsystem such that the computer subsystem can interact with the metrology tool and the inspection subsystem as described further herein. The additional module may be incorporated into the system in the same manner described above.

The hardware of the metrology tool may be disposed in a measurement chamber, that is separate from the inspection subsystem and additional module included in the system. The measurement chamber may be disposed laterally or vertically proximate the inspection subsystem and the additional module. For example, the system may be configured as a cluster of modules that may each be configured to perform different processes. In addition, the measurement chamber, the inspection subsystem, and the additional module may disposed laterally or vertically proximate load chamber 414 of the system. The load chamber may be configured to support multiple specimens such as cassette 416 of specimens that are to be processed in the system. Specimen handler 408 may be configured to remove a specimen from the load chamber prior to measurement and/or inspection and to place a measured and/or inspected specimen into the load chamber. Furthermore, the measurement chamber may be disposed in other locations proximate the inspection subsystem such as anywhere where there is sufficient space for the metrology tool hardware and anywhere a specimen handler may fit such that a specimen may be moved between the measurement chamber and the inspection subsystem. In this manner, specimen handler 408, a stage (not shown), or another suitable mechanical device may be configured to move a specimen to and from the metrology tool and the inspection subsystem of the system.

The embodiments described herein take advantage of the situation in which various areas in a die or on a specimen can give different process information. Although certain embodiments are described herein with respect to first feature(s) in first area(s) and second feature(s) in second area(s) and two areas are shown in some of the figures for illustration, there can or may be more than first and second features in first and second areas, respectively, especially when the embodiments take into consideration structures in the scribe line of the specimens described herein. The embodiments may identify and select suitable features and areas as described further herein. In addition, as far as the figures described further herein, they should not be considered as limitations. All information in the figures described herein are for illustration only, not necessarily in scale and the structures can be more or less complicated such as number of layers, 2D and 3D patterns, etc.

Figure 5A:
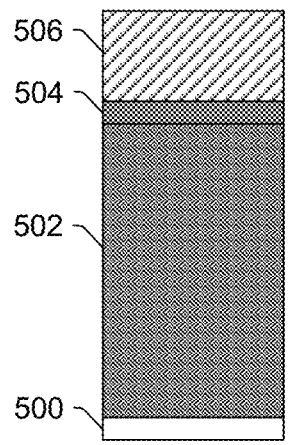
FIG. 5a is a schematic diagram illustrating a cross-sectional view of one example of one or more first features formed in one or more first areas on a specimen.

The one or more computer subsystems are configured for determining first process information for one or more first features formed in one or more first areas on the specimen from the output of the one or more output acquisition subsystems. FIG. 5*a* illustrates one example of suitable first feature(s) formed in first area(s) on a specimen, which in this case is shown as wafer 500, but may be any of the other specimens described herein. The first feature(s) in this case includes a stack of materials including materials 502, 504, and 506. As shown in FIG. 5*a*, then, the first feature(s) may not include patterned structures, but may include thin films such as those shown in FIG. 5*a*. The thin films may be formed on the wafer in any suitable manner using any suitable process known in the art, e.g., one or more of chemical vapor deposition (CVD), physical vapor deposition (PVD), atomic layer deposition (ALD), and the like, which are sometimes followed by process(es) such as chemical mechanical polishing (CMP) that control the thickness or flatness of the thin films. The thin films may include any suitable films known in the art of semiconductor manufacturing such as dielectric films, metal or conductive films, semiconductive films, antireflective coatings, resist (e.g., photoresist) type materials, etc.

Figure 5B:
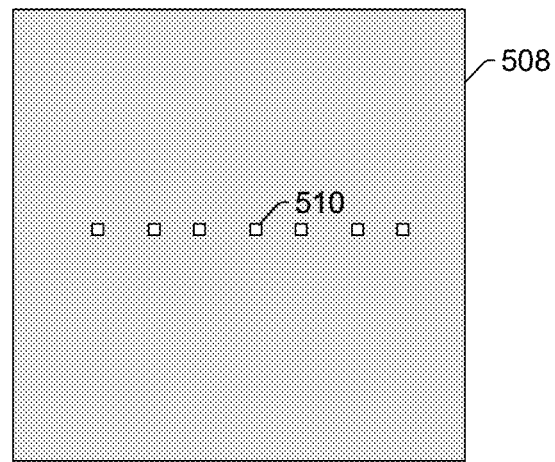
FIG. 5b is a schematic diagram illustrating a plan view of the one or more first areas of FIG. 5a on a specimen.

FIG. 5*b* shows some first areas on the wafer at which the first features shown in FIG. 5*a* may be located. In particular, die 508 shown in FIG. 5*b* includes first areas 510 at which the stack of first features shown in FIG. 5*a* are located. The first areas shown in FIG. 5*b* may or may not include all of the areas in the die in which the first features are shown. For example, first areas at which the first features are formed in a die may be identified based on the design for the specimen, and a subset or fewer than all of the first areas may be selected for use in the embodiments described herein. How many and which of the instances of the first areas are selected for use in the embodiments described herein may be determined based on information such as expected variation in the first process information within a die or across the specimen. The design for the die, the layout of the dies on the specimen, and the scribe line areas (i.e., areas between dies) will ultimately control where the first areas are located in a die or on a specimen, but the first areas that are used by the embodiments may be selected in various other ways such as based on some frequency of first areas selected per unit length or area, a minimum or maximum spacing between first areas selected, a minimum or maximum number of first areas selected, and the like. In addition, although the first areas are shown in FIG. 5*b* arranged in a kind of 1D array, the first areas do not need to be located in any 1D or 2D array and may have irregular spacings between some or all of the first area instances.

The one or more computer subsystems are also configured for determining second process information for one or more second features formed in one or more second areas on the specimen from the output generated by the output acquisition subsystem(s) and at least a portion of the first process information. One new idea of the embodiments described herein is therefore to take advantage of using information from "rich" structures (e.g., in each die) that carries process information from previous steps in different manners. In other words, by the careful selection of the first and second features described herein, important metrology-like information can be determined from inspection-like output for even relatively complicated features.

Figure 5C:
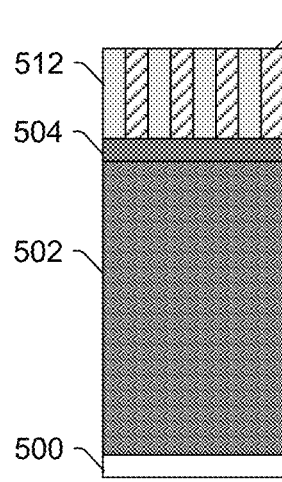
FIG. 5c is a schematic diagram illustrating a cross-sectional view of one example of one or more second features formed in one or more second areas on a specimen.

FIG. 5*c* shows one example of second features that may be selected with the first features shown in FIG. 5*a*. In this example, the second features include materials 502 and 504 formed on wafer 500. Materials 502 and 504 in the second features may be the same as materials 502 and 504 in the first features. For example, materials 502 and 504 may be formed in the same process(es) and of the same materials. The second features also include material 506, but unlike the first features shown in FIG. 5*a*, in the second features this material has been patterned. In other words, patterned features were formed in material 506 in the second features. In addition, material 512 is formed in the second features between the patterned features in material 506. Material 512 may include any suitable material such as those described further herein and may be formed in any suitable manner known in the art.

Figure 5D:
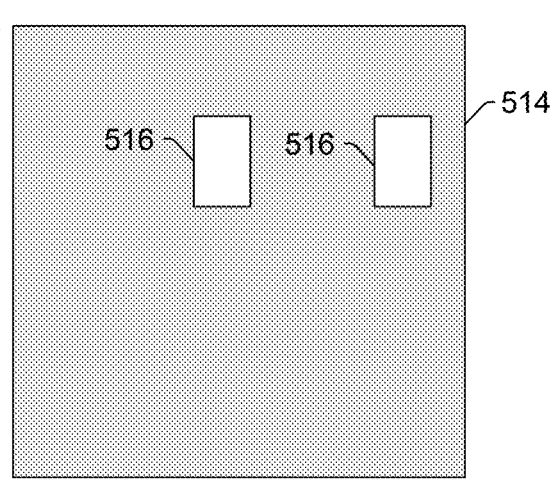
FIG. 5d is a schematic diagram illustrating a plan view of the one or more second areas of FIG. 5c on a specimen.

Unlike the first features shown in FIG. 5*a*, therefore, the second features shown in FIG. 5*c* include a combination of unpatterned thin film layers with patterned structures formed thereon. As such, within a single die on a single specimen, at the same layer of the specimen or process, different areas may have different stacks of structures. In the case of the features shown in FIGS. 5*a* and 5*c*, areas on the wafer in which material 506 is not to be patterned may be "masked off" or covered with a protective material during the lithography and etch processes used to form the patterned features in the material. In one such example, FIG. 5*d* shows second areas 516 in die 514 at which the stack of features shown in FIG. 5*c* are formed. In this manner, during the processes that are used to form the patterned structures in the second areas, the remaining areas in the die may be masked off or patterned in different way such as 2D lines vs. 3D holes. That protective material may then be removed after the patterned features have been formed.

Second areas 516 may be selected as described further herein, e.g., to be fewer than all of the second area instances within a die, based on expected variation in the second process information across a die or a specimen, based on some predetermined criteria for frequency, spacing, etc. In addition, although the first and second areas are shown in FIGS. 5*b* and 5*d* to have different areas relative to one another, there is no limitation or requirement for the relative areas. Other characteristics of the first and second areas, e.g., frequency, spacing, etc., do not have to be selected relative to one another. In other words, the first and second areas may be selected independently of one another as long as the selected areas can be used as described further herein to determine the first and second process information.

Figure 6:
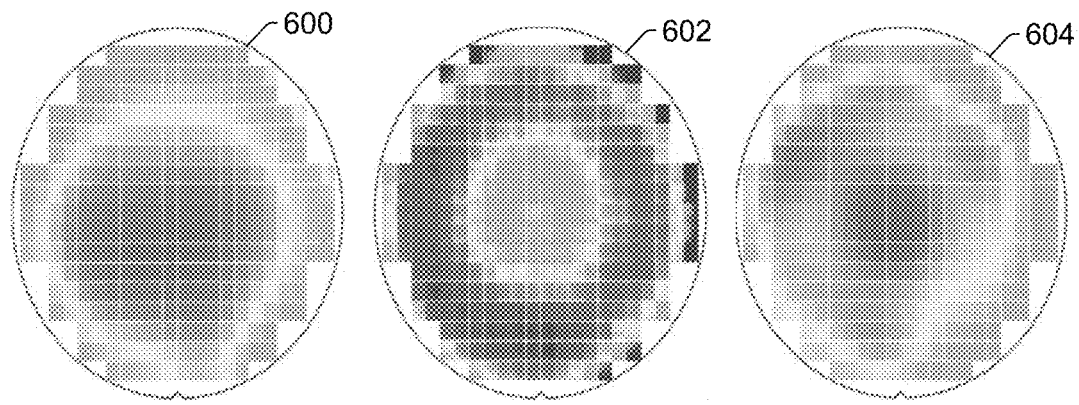
FIG. 6 is a schematic diagram illustrating examples of specimen maps of values of different first process information across a specimen.

The first and second process information may therefore be determined using features formed in discrete areas on the specimen from the output of the inspection subsystem and optionally a metrology tool. The first and second process information may therefore be determined as a function of within die position or within specimen position, and that information as a function of position can be used in various ways described herein. For example, as shown in FIG. 6, the thickness of different materials in the first areas (i.e., the first process information determined for these features) may be shown graphically as a function of within specimen position. In this example, wafer map 600 shows the thickness of material 502, wafer map 602 shows the thickness of material 504, and wafer map 604 shows the thickness of material 506. Different gray levels in the maps correspond to different values of the thickness of the materials. As such, the maps also show variation in the thickness of the materials across the specimen, which can be used to, for example, detect a problem with the process that was used to form the materials.

The maps may be generated with only the thicknesses determined at only the locations of the first areas (e.g., by analysis using a model of the stack shown in FIG. 5a) or the determined first process information in the first areas may be extrapolated or interpolated to other areas on the specimen, which may be performed as described further herein. In this manner, the first process information determined at only specific, discrete areas on the specimen can be used to predict the first process information at other areas on the specimen. Such predictions may be performed and used as described further herein.

Figure 7:
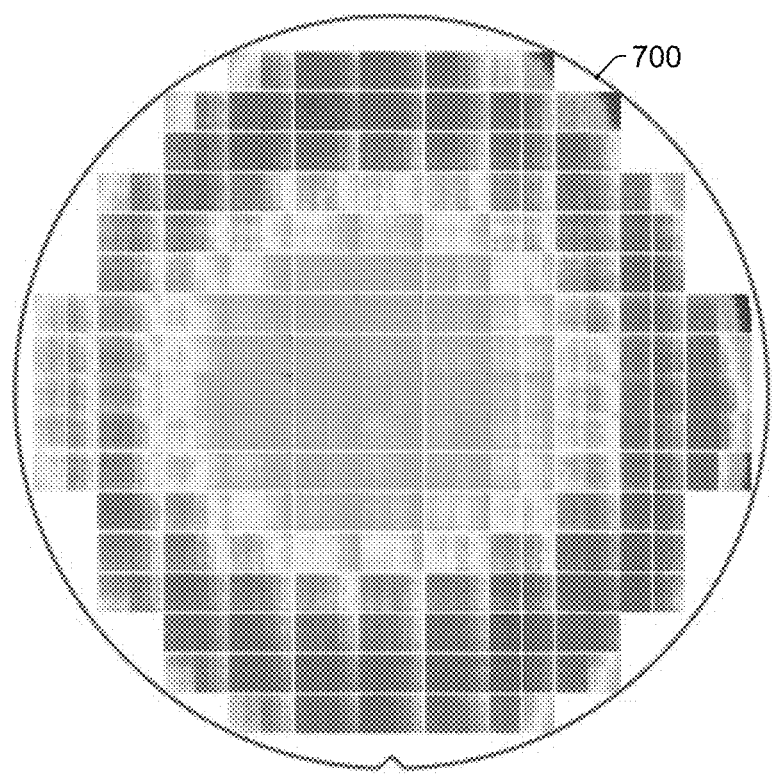
FIG. 7 is a schematic diagram illustrating an example of a specimen map of values of second process information across a specimen.

In a similar manner, the second process information that is determined by the embodiments described herein at the second areas may be used to generate a wafer map such as wafer map 700 shown in FIG. 7. This wafer map may be generated from CD values that are found by analysis of areas shown in FIG. 5d, e.g., using a model for the stack shown in FIG. 5c. Like the wafer maps described above, this wafer map may include only second process information determined for only the second areas. However, the second process information determined for only the selected second areas may also be extrapolated, interpolated, predicted, etc. at other instances of the second features formed on the specimen. Such predictions may also be performed as described further herein. Like the wafer maps described above, a wafer map or other graphical representation of the second process information can be used to detect a problem with a process used to form the second features on the specimen. For example, by analyzing the second information as a function of position on the specimen, the computer subsystem(s) may be able to detect if the process used to form the second features is performing acceptably or how the process is malfunctioning.

In one embodiment, the second process information includes a setting of a process performed on the specimen. For example, by analyzing gray level (GL) data from an inspection tool, one benefit of the embodiments described herein is that they can extract process information that the specimen was made with, which can be process settings, e.g., focus and dose. The process settings that are determined by the embodiments described herein may vary depending on the process(es) that were performed on the specimen prior to scanning. Such process settings may be determined as described further herein, e.g., empirically or using a rigorous model.

In another embodiment, the second process information includes a characteristic of the one or more second features. For example, by analyzing GL data from an inspection tool, another benefit of the embodiments described herein is that they can extract characteristics of the specimen that was made, which can be information related to device performance such as CD, thickness, or etched depth. The specimen characteristic(s) that are determined by the embodiments described herein may vary depending on the process(es) that were performed on the specimen prior to scanning and the second features that are formed on the specimen. Such specimen characteristics may be determined as described further herein, e.g., empirically or using a rigorous model.

At least a portion of the second process information is a different type of information than the first process information. For example, as described above, for the first features shown in FIG. 5a, the first process information may be thicknesses of the thin films formed by materials 502, 504, and 506, and for the second features shown in FIG. 5c, the second process information may be a CD of patterned features formed in material 506 and possibly also or alternatively a CD of patterned features formed by material 512. In this manner, the different process information may be different kinds of dimensions of different kinds of features. Other combinations of different types of first and second process information are also possible depending on, for example, the design for the specimen and therefore what types of information can be generated for the specimen.

Importantly, even though first and second features shown in FIGS. 5a and 5b include the thin films formed of materials 502, 504, and 506, the first and second process information do not both include the thicknesses of these materials. For example, as described further herein, at least a portion of the first process information is used to determine the second process information. Therefore, when determining the second process information, that first process information does not need to be re-determined in the second areas. Instead, the first process information determined in the first areas is effectively fed forward to the second areas for use in determining the second process information. In this manner, if the first process information includes thicknesses of materials 502, 504, and 506, the first process information may be used to determine the thicknesses of these materials in the second areas and then used as known values for determining other information for the second areas. In addition, not all of the first process information needs to be fed forward to the second areas in the embodiments described herein. For example, the first process information may include information about materials 502, 504, and 506 that is of interest to a user but is not useful in determining the second process information.

At least a portion of a design for the one or more second features is different than a design for the one or more first features. For example, as shown in FIGS. 5a and 5c, the first and second areas include the same design for materials 502 and 504. In addition, although the first and second areas include material 506, in the first areas that material is unpatterned while in the second areas that material is patterned. Therefore, the design of material 506 is different in the first and second areas. In addition, the second areas shown in FIG. 5c include material 512 formed within the patterned features formed in material 506, while the first features include no such material. Therefore, the portion of the design for the one or more second features in FIG. 5c that is different than the design for the one or more first features in FIG. 5a includes the design for materials 506 and 512.

Such differences between the design for the first and second features may be enabled on the same layer of the specimen in a number of manners such as a temporary masking layer formed on at least the portion of the specimen containing the first areas while the patterned features are formed in materials 506 and 512 in the second areas thereby preventing the patterning of material 506 and formation of material 512 in the first areas. While at least a portion of the design for the first and second features is different, at least a portion of the design for the first and second features should also be the same. For example, since both the first and second features include materials 502 and 504, thicknesses or other information for these materials determined using the first areas can be used with the output generated for the second areas to determine information for the second features. In addition, even though material 506 is patterned in the second features but unpatterned in the first features, a thickness of material 506 (or other characteristic(s)) determined in the first areas can be used in the same way for the second features.

In other words, the first and second features described herein are linked by some common design properties shared by these two features. Referring to FIG. 5 as an example, the common properties of the first features (FIG. 5a) and the second features (FIG. 5c) are the thicknesses of materials 502 and 504, and presumably the thickness of material 506 in the first features is the same as the height of the patterned features formed in material 506 in the second features. After determining the first process information of the first features by analyzing the output generated in the first areas (such as those shown in FIG. 5b) and extending that to all (or other) locations on the specimen, which may be performed as described further herein, then the first process information of the second features at locations of the second areas (e.g., as shown in FIG. 5d) is determined and used in combination with the output generated for the second features for analyzing the second features. Similarly, when information at locations of the second areas such as those shown in FIG. 5d are obtained by analyzing the second features (shown in FIG. 5c), that information can be extended to the full specimen as described herein.

In this manner, one important innovation that makes the embodiments described herein possible is the careful selection of first and second features that have both similarities and differences in design, which makes determination of some process information easier by using relatively simple features formed in first area(s) on the specimen and enables using that process information for determining other process information in more complicated features. Without this important innovation, it may not be possible to determine information for relatively complicated features such as those shown in FIG. 5c using an inspection subsystem.

The one or more first areas and the one or more second areas are mutually exclusive on the specimen. In other words, the first and second areas are not the same or overlapping areas (defined in the x-y plane) on the specimen. For example, the first and second features are not simply different features formed on top of each other in the same area of the specimen. In this manner, if the first process information is determined for first features at one location on a specimen, the second process information is not determined for second features at the same location from output of an inspection subsystem generated at that same location. In other words, the first process information is not determined for first features that underly second features that are used to determine the second process information. Instead, the second features are not formed above the first features in the first areas that are used to determine the first process information. In addition, the second features may not be formed at all in the first areas used to determine the first process information. For example, the output generated at only the second areas is not used to determine the first and second process information for the features shown in FIG. 5c. Instead, the output used to determine the first and second process information is generated at mutually exclusive areas such as those shown in FIGS. 5b and 5d so that different areas containing different stacks of features are used to determine different process information. In particular, as described further herein, the embodiments described herein take advantage of the instance when a specimen has different features formed in different areas on the specimen after completion of a process step, which can be advantageously used to determine different process information for the specimen.

In one embodiment, one or more of the first and second areas are located in a functional area of a device being formed on the specimen. Examples of the "rich" structures suitable for use in the embodiments described herein can be different areas in the functional areas of devices such as memory vs. logic or connection (vias). Often, one can find the patterns and cross-sectional structures of those areas are different: some were masked off at certain patterning steps while others are at different steps. These areas can be relatively large (e.g., as a significant part of a die) or relatively small (e.g., as small as a few micrometers may often be seen).

In another embodiment, one or more of the first and second areas are located in a scribe line area between devices being formed on the specimen. For example, more examples of the "rich" structures can be found in scribe lines, designed as test structures for tool alignment or metrology (CD, thickness, overlay, etc.). These test structures are designed often to isolate process steps (by masking off certain process(es)), which can be substantially useful for the embodiments described herein because it enhances (good for gaining clear signal) and removes (good to simplify data analysis process) information from desired process steps.

In such embodiments, both the first and second areas may be located in the scribe line areas. However, all of the first areas may be located in the scribe line area, and all of the second areas may be located in the functional area(s). The reverse is also possible. In particular, where suitable first and second features are available and selected for use may be largely dependent on the design for the specimen, and whether the features are located in the functional device areas or the scribe line areas may not be particularly important for the embodiments described herein. For example, even if it may be preferable to use features in functional areas for many quality control type processes such as those described herein, other considerations such as throughput, feature availability, etc. may make features in non-functional areas more attractive for use in the embodiments described herein.

As described above, the output acquisition subsystem(s) may include a metrology tool configured to generate at least another portion of the output by performing measurements at measurement points on the specimen. In one such embodiment, the output used to determine the first process information includes only the at least another portion of the output, and the output used to determine the second process information includes the at least the portion of the output. In other words, the first process information may be determined using only metrology tool output, and the second process information may be determined using (1) only inspection subsystem output or (2) inspection subsystem output in combination with metrology tool output. Whether the output generated by a single tool or multiple tools are used to determine the first and second process information, determining the first and second process information may be performed as described further herein.

The metrology tool described above may also not be needed at all for determining the first (or any of the) process information described herein. For example, in another embodiment, the output used to determine the first process information includes only the output generated by the inspection subsystem, and the output used to determine the second process information includes only the output generated by the inspection subsystem. In this manner, neither the first nor the second process information is determined using metrology tool output.

In some such embodiments, the output used to determine the first and second process information is generated in the same scan of the specimen. For example, the first process information may be determined from output generated by the same inspection hardware used to determine the second process information but by scanning over the first feature(s) in the first area(s) rather than the second feature(s) in the second area(s). Physically, the scan by the inspection hardware can often be performed at the same time to cover both the first areas and the second areas where the first and second features are located, respectively. Therefore, although a metrology tool may be used to measure the first feature(s), an inspection subsystem may be used to generate output for the first feature(s) often in the same scan for the second feature(s) in the second area(s). The output generated in the first and second areas in the same scan may then be used as described herein to determine the first and second process information, respectively.

While the first process information may be determined from the output generated by the inspection subsystem, that is not necessary and the first process information may be determined using metrology data. In contrast, however, there are advantages to determining the second process information from output generated by an inspection subsystem instead of a metrology tool. For example, an inspection tool will generally record information at all locations on a specimen (e.g., wafer), which provides the opportunity of having and analyzing this information. Such data collection and availability is an essential difference from metrology tools. In particular, a metrology tool obtains information only at limited points on a specimen (e.g., wafer), say less than 300 points and often only about 5 to 18 points.

As described above, therefore, different tools may be used for determining different process information. As such, the embodiments described herein may make use of a combination of different tools such as an inspection tool and a thin film metrology tool. One advantage of using different tools is that different tools may enable measurement of more complicated structures compared to a single tool. However, using multiple tools instead of a single tool can have a number of tradeoffs. For example, using multiple tools can require a longer measurement time, multiple load/unload operations of the specimen on different tools, and metrology tools typically have move-acquire-measurement (MAM) times of about 0.5 second so that a limited number of locations can be measured, which can cause challenges in meeting throughput targets while acquiring enough data for interpolating/extrapolating to the full specimen.

In the same way that the embodiments described herein may be implemented using only one or multiple tools, the embodiments may also be implemented using only a single mode of a single tool or multiple modes of a single tool. For example, as described further herein, a tool may generate output for a specimen with different modes. Different modes may be more or less sensitive to different information. In one such example, a first mode of an inspection subsystem may be more sensitive to film thickness while a second mode of the inspection subsystem may be more sensitive to CD of patterned features. Therefore, the first mode may be used to determine thicknesses of materials 502, 504, and 506 of the first features shown in FIG. 5a while the second mode may be used to determine a CD of patterned features formed in material 506 and/or material 512 shown in FIG. 5c. In another such example, a first mode of an inspection subsystem may be more sensitive to CD of patterned features while a second mode of the inspection subsystem may be more sensitive to side wall angle (SWA) of patterned features. Therefore, the first mode may be used to determine a CD of the patterned features formed in material 506 and/or material 512 shown in FIG. 5c, and the second mode may be used to determine SWA of the patterned features formed in material 506 and/or 512. In this manner, a single mode may be used to determine different information for different types of features, and different modes may be used to determine different information for the same features and/or different information for different features. The output generated using a single mode or multiple modes may be otherwise used as described herein to determine the first and second process information (e.g., with different models or the same model, with the types of models described herein, etc.).

Whether the output acquisition subsystem(s) include only one inspection subsystem or an inspection subsystem and a metrology tool (or other output acquisition subsystem), the operation of data taken, transform, and pre-process such as applying additional calibrations may be the same as the practice today. The difference between what is currently done and the embodiments described herein mainly starts from analysis of the pre-processed data, while rigorous model(s) may be built and certain process parameters (e.g., thickness, CD, SWA, etc.) are extracted via model analysis.

In another embodiment, the output used to determine the first process information is not generated until the one or more second features are formed on the specimen. For example, unlike currently used methods and systems, the embodiments described herein do not need additional measurements taken prior to the last process performed on the specimen and take advantage of the relatively great amount of information over all locations on the wafer and different characteristic wafer signatures associated with different processes. The embodiments described herein also do not need to track measurement data from previous process(es), which can often cause data logistic challenges in practice.

The embodiments described herein are therefore unlike currently used methods and systems that use some of the feed forward applications of metrology such as feeding parameters from a previous layer to a current layer or feeding data from another tool (e.g., a CD-SEM) into a current metrology mode (e.g., optical CD metrology). Instead, as described herein, the embodiments through careful selection of the first and second features in first and second areas, respectively, can perform all of the measuring and scanning (or only scanning) after the same process step and use an inspection subsystem for determining at least some of the process information. The embodiments described herein therefore provide several advantages over currently used methods and systems including that they can be performed in a shorter time and with greater ease while also providing significantly more information per unit area on the specimen.

In one embodiment, the one or more computer subsystems are configured for determining one or more of the first and second process information using an empirically determined relationship. For example, in practice, one method that can be used by the embodiments described herein is an empirical method by training design of experiments (DOE) input with the GL response then applying the relationship to find process parameters from GL. An empirically determined relationship may be determined in any suitable manner known in the art. In some instances, a process window qualification (PWQ) or focus exposure matrix (FEM) type specimen can be fabricated and measured to determine an empirical relationship. The empirical relationship may also be determined using a deep learning (DL) or machine learning (ML) type model. However, any type of function, relationship, model, etc. may be used to describe the empirically determined relationship for use by the embodiments described herein.

In a further embodiment, the one or more computer subsystems are configured for determining one or more of the first and second process information using a rigorous model. For example, in practice, another method that can be used by the embodiments described herein is a rigorous method by modeling the system (including inspection hardware and the specimen under test) rigorously. When a rigorous method or algorithm is used, one typical limitation of such a method or algorithm is handling multiple parameters needed to describe the structure on the specimen while the information from the inspection tool is often very limited at each pixel. The parameters for structures on blank specimens are simple: film thickness given that the optical constants of each layer are well known in general. The parameters for structures on patterned specimens are significantly larger, e.g., CD, SWA, pitch walking, etch depth, etch residue, topping or rounding both in cross-section and top down views, and the like. This greatly increased number of parameters gives challenge to rigorous methods: one cannot measure all of them since there are very limited measurement information contents per pixel from inspection tools; one cannot fix these parameters since most of them vary from die-to-die and specimen-to-specimen; and this variation often causes noticeable GL change of the inspection signal. The embodiments described herein however propose a solution that can be used to greatly resolve this challenge.

In some embodiments, the computer subsystem(s) are configured for selecting the first process information, the one or more first features, the one or more first areas, the one or more second features, and the one or more second areas based on information for a design for the specimen and one or more processes performed on the specimen. In general, the second process information that is determined by the embodiments will be set by a user or based on the process and specimen being examined. Therefore, the computer subsystem(s) may not need to select the second process information. However, the computer subsystem(s) may identify various areas in a die that can give different process information. The computer subsystem(s) may also make a strategy of analysis, including understanding the processes to make these structures and the characteristics of process variations. Selecting the features, areas, information, etc. may be performed as described further herein. In particular, as described further herein, selection of the first and second areas, the first and second features, etc. is important to make possible determining information using the first features in the first areas that are relatively simple structures and using that information for determining other information for second features in the second areas that are more complex than the first features. In this manner, information that can be relatively easily determined using the first features can also be used for determining information for the second features thereby making determination of the second process information easier.

Examples of such strategy and understanding for the structures shown in FIGS. 5a and 5c can include, but are not limited to the following. The thicknesses of materials 502, 504, and 506 are controlled by a film deposition process performed on the specimen by a film deposition tool and characteristic variation length of the thicknesses can be a fraction to tens of centimeters (cm). The thicknesses of these materials are not expected to be changed by a patterning process, etc. performed on the specimen after the materials have been formed thereon. The CD of material 512 can have characteristic variation length on the order of micrometers ($\mu$m) to cm and may have two components: one synchronized with the die from the lithography process, and another asynchronized with die and related to lithography and etch processes.

Based on the above information, the computer subsystem(s) may develop a strategy that includes analyzing the first areas shown in FIG. 5b to find the thicknesses of materials 502, 504, and 506. The strategy may also include taking advantage of the fact that variation of these thicknesses is relatively slow so that the thicknesses across the specimen can be found by interpolating or extrapolating the measured thicknesses in the first areas to all or desired areas (such as areas shown in FIG. 5d) on the specimen, which may be performed as described further herein. In addition, for the second areas shown in FIG. 5d, the strategy may include feeding forward the thicknesses of materials 502, 504, and 506 found in the previous step to a model, then the CD or other patterning parameters in areas of FIG. 5d are determined.

In another embodiment, the one or more computer subsystems are configured for determining one or more methods used for determining the first and second process information based on information for a design for the specimen and one or more processes performed on the specimen. For example, the computer subsystem(s) may perform data analysis per strategy layout above in detail. The computer subsystem(s) may also build a thin film model for the materials shown in FIG. 5a and apply the model to GL from the first areas in FIG. 5b to thereby find the thicknesses of materials 502, 504, and 506. The computer subsystem(s) may also extend the determined thicknesses to the full specimen such as shown in FIG. 6. The computer subsystem(s) may further build a model for the patterned structure as shown in FIG. 5c for the area(s) in FIG. 5d, feed the thicknesses in FIG. 6 into the model of the second features as predetermined quantities, and process the output generated in the second areas to find the CD value of material 512 (for example) in the model of the second features. The example of the CD value of material 512 as a function of position on the specimen is shown in FIG. 7.

In an embodiment, determining the first process information includes applying a first method to the output, determining the second process information includes applying a second method to the output and at least the portion of the first process information, and the first and second methods are different. For example, the first and second methods may include different models of the same or different type (e.g., one empirical model and one rigorous model), and using different models to determine different process information may be most suitable since the features in the different areas are different and different process information is being determined. Each of the different methods may be determined and used as described further herein.

Although the different methods may be applied sequentially, i.e., using the first method to determine the first process information and then the second method to determine the second process information, the methods may also be applied simultaneously. For example, the models for the first and second features such as those shown in FIGS. 5a and 5c can be analyzed concurrently in the output processing while each model applies to output from its own area, e.g., FIGS. 5b and 5d, respectively.

In another embodiment, the one or more computer subsystems are configured for performing a single method for determining the first and second process information. For example, a single method may be used to implement the embodiments described herein, whether that single method involves a single model or more than one model. In other words, determining the first and second process information does not have to be implemented as different determinations. In one such example, although multiple models may be used to describe different relationships between the output and the first process information and the output and the second process information, those multiple models may be combined into a single method that uses the multiple models.

In one such embodiment, input to the single method is the output generated for the specimen by the one or more output acquisition subsystems, and output of the single method is the second process information. In other words, output generated for the first and second areas (regardless of how the output for the different areas is generated) may be input to a single method, which may output the second process information (and possibly only the second process information). For example, although the embodiments described herein may determine the first process information, that first process information may be determined primarily for the purpose of enabling the determination of the second process information.

In this manner, the first process information is not necessarily being determined by the embodiments described herein because it is of interest to the user. In one such example, if the first process information includes the thicknesses of materials 502, 504, and 506 of the first features shown in FIG. 5a, the user may not be particularly interested in this information. Instead, this information may only be determined to enable the determination of the CD of the patterned features in material 506 and/or the patterned features formed of material 512 in the second features shown in FIG. 5c. Therefore, although the first process information may be determined, it is not necessary to output that information or to report it to a user. In other instances, a user may be interested in both the first and second process information. In such instances, regardless of whether the first and second process information is determined by a single method or in another way described herein, both the first and second process information may be reported to the user.

In a further embodiment, the one or more computer subsystems are configured for determining third process information for one or more third features formed in one or more third areas on the specimen from the output; at least a portion of the first process information is different than the third process information; at least a portion of a design for the one or more first features is different than a design for the one or more third features; the one or more first areas, the one or more second areas, and the one or more third areas are mutually exclusive on the specimen; and the one or more computer subsystems are configured for determining information for the first process information based on the third process information. For example, the embodiments described herein may be configured for some optional steps. In some use cases, additional steps may be desired beyond what is described in other embodiments. In one such example, the computer subsystem(s) may cross check results from different areas. For example, there may be additional areas on the specimen other than those shown in FIGS. 5a and 5c that have structures similar to FIG. 5a but without a layer of material 506. Thus, thicknesses of materials 502 and 504 can be determined in those additional areas and can be extended to the full specimen, which may be performed as described further herein. The thicknesses determined for those materials may then be used for checking the results in FIGS. 6 and 7. Alternatively, the data in the third areas can be analyzed jointly with the model and data for the features shown in FIGS. 5a and/or 5c.

The computer subsystem(s) may also be configured for determining locations of the second area(s) on the specimen with respect to locations of the first area(s) on the specimen. Determining the locations of the second area(s) on the specimen with respect to the locations of the first area(s) may include coordinate system matching if different tools (e.g., metrology and inspection) are used to generate output for the first and second areas. In particular, different tools may report locations in different coordinate systems. Therefore, the coordinate systems can be matched to then determine the locations of the second area(s) with respect to the locations of the first area(s). The parameters that may be matched may include die size, die center location (0,0 die), reticle (exposure field) sizes, and die/reticle origin.

That matching can be performed in a number of different ways. For example, one or more common reference points on a specimen that can be measured or detected by both tools can be identified and used to determine one or more offsets between the different coordinates used and/or reported by the different tools. Those one or more offsets can then be used to translate any one reported location from one coordinate system to another. In a similar manner, in order to test a potential correct match of different tool coordinate systems, a specific measurement point that has been measured by a first tool can be scanned by a second tool so that an x, y location reported by the second tool can be compared, correlated, and/or matched to the x, y location used in the first tool. Once the second area coordinates have been translated to the coordinate system used for determining the first area locations or vice versa, the locations of the second area(s) with respect to the first area location(s) may be determined.

These relative locations may be determined in any suitable manner. In some instances, the second area locations with respect to the first area locations may be determined simply as the second area locations in the common coordinate system generated by coordinate system matching or translation. However, determining the second area locations with respect to the first area locations may also or alternatively include determining an offset or distance between each of the second area locations and the location(s) of the one or more closest first areas in the common coordinate system generated by coordinate system matching or translation. Determining the locations of these second area(s) with respect to the location(s) of the first areas may therefore also include determining which of the first area(s) is/are closest to the second area locations, and that information may also be stored with the corresponding second area locations. In general, therefore, different methods can be used in the embodiments described herein to determine the relative locations between the first and second area locations in a common coordinate system.

Since, as described further herein, the first area(s) and the second area(s) are mutually exclusive of each other on the specimen, the computer subsystem(s) may be configured for determining or predicting the first process information at locations of the second area(s) from the first process information generated at the first area(s) and the locations of the second area(s) determined with respect to the locations of the first areas. For example, the first process information generated at the first area(s) may be used to predict the first process information at the location(s) of the second area(s) using one of the methods described herein.

In one embodiment, determining the second process information includes interpolation of the first process information from the one or more locations of the one or more first areas to one or more locations of the one or more second areas. Interpolation can be generally defined in the art as the prediction of values within a given data range. The interpolation used in the predicting step may include any suitable interpolation method known in the art. Examples of suitable interpolation methods include, but are not limited to, linear interpolation, polynomial interpolation, spline interpolation, non-linear interpolation, interpolation via a Gaussian process, multivariate interpolation, bilinear interpolation, and bicubic interpolation, all of which may be performed in any suitable manner known in the art.

In another embodiment, determining the second process information includes extrapolation of the first process information from the one or more locations of the one or more first areas to one or more locations of the one or more second areas. Extrapolation can be generally defined in the art as the prediction of data outside of a given data range. There are different methods that can be used for extrapolation. One such extrapolation method is contour plot based extrapolation. For example, once the first process information has been acquired, a contour plot for the first process information can be generated in any suitable manner known in the art. Once a contour plot is available, a value of the first process information can be extracted for each point on the specimen in a user-defined grid size. This first process information can then be applied to second area location(s) within that same grid. In this manner, first process information can be assigned to each second area location according to the value of the grid in which the second area location is located.

Extrapolation is therefore one way to extend/generalize information determined in some areas on the specimen to the full specimen. In some applications, extrapolation may also be performed to apply the information from the first features to the second features, e.g., the height of material 506 in FIG. 5c may not be exactly the same as the thickness of material 506 in FIG. 5a due to process characteristics. Rather, the height of material 506 in FIG. 5c may be a function of the thickness of material 506 in FIG. 5a and the line width (CD) of material 506 in FIG. 5c. This function can be predetermined as a given characteristic property and be used in analyzing the second features in FIG. 5c. Here, the extrapolation can be linear or nonlinear. Therefore, extrapolation is one method that may be used to extend information at some locations to other locations, and the actual implementation (extrapolation or another extension method) may also involve process information—that is, how the specimen has been made so far.

In some embodiments, the computer subsystem(s) are configured for detecting defects on the specimen by modifying the at least the portion of the output generated by the inspection subsystem with one or more of the first and second process information thereby generating modified output and applying a defect detection method to the modified output. For example, by analyzing GL data from an inspection tool as described herein, another benefit of the embodiments described herein is that they can be used to enhance inspection sensitivity by "stripping off" the main GL signal component that is from the structure desired or variations that are not of interest.

The defect detection method may otherwise include any suitable defect detection method known in the art. In one such (very simple) example, the defect detection method may include subtracting the output of the inspection subsystem generated at corresponding within die positions and applying a threshold to the results of the subtraction. Any output that is above the threshold may be determined to be a defect (or potential defect) by the defect detection method while any output that is below the threshold may not be identified as a potential defect.

The computer subsystem(s) may be configured for storing the second process information with any of the other results described herein and in any manner known in the art. The computer subsystem(s) may store the second process information and any other information or results described herein in any storage medium described herein or any other suitable storage medium known in the art. After the information has been stored, the information can be accessed in the storage medium and used by any of the method or system embodiments described herein, formatted for display to a user, used by another software module, method, or system, etc. For example, the computer subsystem(s) may use the second process information to generate or alter a process recipe as described herein. That process recipe may then be stored and used by the system or method (or another system or method) to perform a process on the specimen or other specimens to thereby alter the specimen or other specimens in some manner.

The second process information and other results and information generated by the embodiments described herein may be used in a variety of manners by the embodiments described herein and/or other systems and methods. Such functions include, but are not limited to, altering a process such as a fabrication process or step that was or will be performed on the specimen for which the information was determined or another specimen in a feedback or feedforward manner. For example, the computer subsystem(s) described herein may be configured to determine one or more changes to a process that was performed on a specimen for which the information was determined as described herein and/or a process that will be performed on the specimen based on the second process information. The changes to the process may include any suitable changes to one or more parameters of the process.

The computer subsystem(s) may determine such changes so that a process that may have been operating outside of control limits can be brought back into control. For example, the computer subsystem(s) may determine a setting of a process as the second process information and use that setting to determine if the setting is outside of control limits and when it is determined to be outside of control limits, how to bring it back within control. In another example, the computer subsystem(s) may determine a metrology-like characteristic of the first and/or second features as the first and/or second information, which can be used to determine if a process performed on the specimen is producing specimen(s) with acceptable value(s) of that metrology-like characteristic. If the process is determined to be out of control based on the first and/or second process information, the computer subsystem(s) may determine one or more changes to the process that will cause the process to fabricate specimen(s) with acceptable value(s) of the metrology-like characteristic. The computer subsystem(s) described herein may determine any of the changes described above in any suitable manner known in the art.

Those changes can then be sent to a semiconductor fabrication system (not shown) or a storage medium (not shown) accessible to the computer subsystem(s) and the semiconductor fabrication system. The semiconductor fabrication system may or may not be part of the system embodiments described herein. For example, the computer subsystem(s), inspection subsystem, metrology tool, etc. described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

Rather than just storing the second process information or other information described herein in a storage medium, the computer subsystem(s) may store such information in a recipe or by generating a recipe for a process that will be performed based on that information. A "recipe" as that term is used herein is defined as a set of instructions that can be used by a tool to perform a process on a specimen. In this manner, generating a recipe may include generating information for how a process is to be performed, which can then be used to generate the instructions for performing that process. The computer subsystem(s) may also store any information for the second process information that can be used to identify, access, and/or use the second process information (e.g., such as a file name and where it is stored).

As described herein, therefore, the embodiments can be used to setup a new process or recipe. The embodiments may also be used to modify an existing process or recipe. The embodiments described herein are not limited to fabrication recipe or process creation or modification. For example, the embodiments described herein can also be used to setup or modify a recipe or process for metrology, defect review, etc. in a similar manner. The embodiments described herein can therefore be used not just for setting up or modifying a fabrication process but also for setting up or modifying any quality control type process performed on the specimens described herein and any parameters of such a process.

Each of the embodiments of each of the systems described above may be combined together into one single embodiment.

Another embodiment relates to a computer-implemented method for determining information for a specimen. The method includes generating output responsive to energy detected from a specimen by one or more output acquisition subsystems configured as described herein. The method also includes determining first process information and second process information, which may be performed according to any of the embodiments described herein. Determining the first and second process information are performed by one or more computer subsystems coupled to the one or more output acquisition subsystems.

Each of the steps of the method may be performed as described further herein. The method may also include any other step(s) that can be performed by the output acquisition subsystem(s), computer subsystem(s), inspection subsystem, metrology tool, and/or system(s) described herein. The one or more computer subsystems may be configured according to any of the embodiments described herein. In addition, the method described above may be performed by any of the system embodiments described herein.

Figure 8:
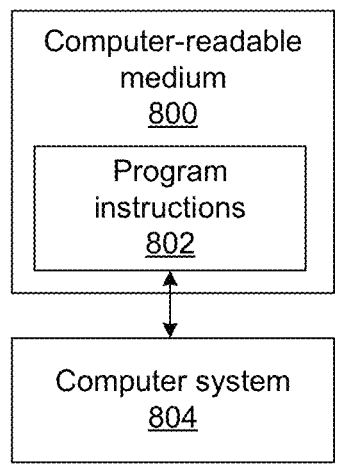
FIG. 8 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for determining information for a specimen. One such embodiment is shown in FIG. 8. In particular, as shown in FIG. 8, non-transitory computer-readable medium 800 includes program instructions 802 executable on computer system 804. The computer-implemented method may include any step(s) of any method(s) described herein.

Program instructions 802 implementing methods such as those described herein may be stored on computer-readable medium 800. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 804 may be configured according to any of the embodiments described herein.

Further modifications and alternative embodiments of various aspects of the invention will be apparent to those skilled in the art in view of this description. For example, methods and systems for determining information for a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for determining information for a specimen, comprising:

one or more output acquisition subsystems configured to generate output responsive to energy detected from a specimen, wherein the one or more output acquisition subsystems comprise an inspection subsystem configured to generate at least a portion of the output responsive to the energy detected from the specimen while the energy is scanned over the specimen; and one or more computer subsystems configured for:
- determining first process information for one or more first features formed in one or more first areas on the specimen from the output; and
- determining second process information for one or more second features formed in one or more second areas on the specimen from the output and at least a portion of the first process information, wherein at least a portion of the second process information is a different type of information than the first process information, wherein at least a portion of a design for the one or more second features is different than a design for the one or more first features, and wherein the one or more first areas and the one or more second areas are mutually exclusive on the specimen.

2. The system of claim 1, wherein the output used to determine the first process information comprises only the output generated by the inspection subsystem, and wherein the output used to determine the second process information comprises only the output generated by the inspection subsystem.

3. The system of claim 2, wherein the output used to determine the first and second process information is generated in the same scan of the specimen.

4. The system of claim 1, wherein the one or more output acquisition subsystems further comprise a metrology tool configured to generate at least another portion of the output by performing measurements at measurement points on the specimen, wherein the output used to determine the first process information comprises only the at least another portion of the output, and wherein the output used to determine the second process information comprises the at least the portion of the output.

5. The system of claim 1, wherein the output used to determine the first process information is not generated until the one or more second features are formed on the specimen.

6. The system of claim 1, wherein the second process information comprises a setting of a process performed on the specimen.

7. The system of claim 1, wherein the second process information comprises a characteristic of the one or more second features.

8. The system of claim 1, wherein the one or more first areas are selected to capture specimen level variations in the first process information.

9. The system of claim 1, wherein the one or more first areas are selected to capture die level variations in the first process information.

10. The system of claim 1, wherein the one or more computer subsystems are further configured for detecting defects on the specimen by modifying the at least the portion of the output generated by inspection subsystem with one or more of the first and second process information thereby generating modified output and applying a defect detection method to the modified output.

11. The system of claim 1, wherein the one or more computer subsystems are further configured for determining one or more of the first and second process information using an empirically determined relationship.

12. The system of claim 1, wherein the one or more computer subsystems are further configured for determining one or more of the first and second process information using a rigorous model.

13. The system of claim 1, wherein determining the second process information comprises interpolation of the first process information from one or more locations of the one or more first areas to one or more locations of the one or more second areas.

14. The system of claim 1, wherein determining the second process information comprises extrapolation of the first process information from one or more locations of the one or more first areas to one or more locations of the one or more second areas.

15. The system of claim 1, wherein the one or more computer subsystems are further configured for selecting the first process information, the one or more first features, the one or more first areas, the one or more second features, and the one or more second areas based on information for a design for the specimen and one or more processes performed on the specimen.

16. The system of claim 1, wherein the one or more computer subsystems are further configured for determining one or more methods used for determining the first and second process information based on information for a design for the specimen and one or more processes performed on the specimen.

17. The system of claim 1, wherein determining the first process information comprises applying a first method to the output, wherein determining the second process information comprises applying a second method to the output and the at least the portion of the first process information, and wherein the first and second methods are different.

18. The system of claim 1, wherein the one or more computer subsystems are further configured for performing a single method for determining the first and second process information.

19. The system of claim 18, wherein input to the single method is the output generated for the specimen by the one or more output acquisition subsystems, and wherein output of the single method is the second process information.

20. The system of claim 1, wherein the one or more computer subsystems are further configured for determining third process information for one or more third features formed in one or more third areas on the specimen from the output, wherein at least a portion of the first process information is different than the third process information, wherein at least a portion of the design for the one or more first features is different than a design for the one or more third features, wherein the one or more first areas, the one or more second areas, and the one or more third areas are mutually exclusive on the specimen, and wherein the one or more computer subsystems are further configured for determining information for the first process information based on the third process information.

21. The system of claim 1, wherein one or more of the first and second areas are located in a functional area of a device being formed on the specimen.

22. The system of claim 1, wherein one or more of the first and second areas are located in a scribe line area between devices being formed on the specimen.

23. The system of claim 1, wherein the inspection subsystem is further configured as an optical inspection subsystem.

24. A non-transitory computer-readable medium, storing program instructions executable on a computer system for performing a computer-implemented method for determining information for a specimen, wherein the computer-implemented method comprises:
- generating output responsive to energy detected from a specimen by one or more output acquisition subsystems, wherein the one or more output acquisition subsystems comprise an inspection subsystem configured to generate at least a portion of the output responsive to the energy detected from the specimen while the energy is being scanned over the specimen;

determining first process information for one or more first features formed in one or more first areas on the specimen from the output; and determining second process information for one or more second features formed in one or more second areas on the specimen from the output and at least a portion of the first process information, wherein at least a portion of the second process information is a different type of information than the first process information, wherein at least a portion of a design for the one or more second features is different than a design for the one or more first features, wherein the one or more first areas and the one or more second areas are mutually exclusive on the specimen, and wherein determining the first and second process information are performed by the computer system.

25. A computer-implemented method for determining information for a specimen, comprising:

generating output responsive to energy detected from a specimen by one or more output acquisition subsystems, wherein the one or more output acquisition subsystems comprise an inspection subsystem configured to generate at least a portion of the output responsive to the energy detected from the specimen while the energy is being scanned over the specimen;

determining first process information for one or more first features formed in one or more first areas on the specimen from the output; and determining second process information for one or more second features formed in one or more second areas on the specimen from the output and at least a portion of the first process information, wherein at least a portion of the second process information is a different type of information than the first process information, wherein at least a portion of a design for the one or more second features is different than a design for the one or more first features, wherein the one or more first areas and the one or more second areas are mutually exclusive on the specimen, and wherein determining the first and second process information are performed by one or more computer subsystems coupled to the one or more output acquisition subsystems.

* * * * *